United States Patent
Medina et al.

(10) Patent No.: US 7,755,526 B2
(45) Date of Patent: Jul. 13, 2010

(54) SYSTEM AND METHOD TO MODIFY A METADATA PARAMETER

(75) Inventors: Douglas Medina, Grain Valley, MO (US); Larry Kennedy, Lawrence, KS (US); Frank Robert Coppa, North Kansas City, MO (US)

(73) Assignee: AT&T Intellectual Property I, L.P., Reno, NV (US)

( * ) Notice: Subject to any disclaimer, the term of this patent is extended or adjusted under 35 U.S.C. 154(b) by 0 days.

(21) Appl. No.: 12/262,742

(22) Filed: Oct. 31, 2008

(65) Prior Publication Data

US 2010/0109926 A1 May 6, 2010

(51) Int. Cl.
*H03M 1/66* (2006.01)
(52) U.S. Cl. .................................. 341/144; 341/120
(58) Field of Classification Search .................. 341/144, 341/120, 118; 381/104, 107, 122
See application file for complete search history.

(56) References Cited

U.S. PATENT DOCUMENTS

| | | | | |
|---|---|---|---|---|
| 5,892,834 | A * | 4/1999 | Smart et al. | 381/106 |
| 7,398,207 | B2 * | 7/2008 | Riedl | 704/225 |
| 7,617,109 | B2 * | 11/2009 | Smithers et al. | 704/500 |
| 2004/0044525 | A1 | 3/2004 | Vinton et al. | |
| 2006/0002572 | A1 | 1/2006 | Smithers et al. | |
| 2007/0064954 | A1 | 3/2007 | Booth et al. | |
| 2007/0256014 | A1 | 11/2007 | Du Breuil | |

OTHER PUBLICATIONS

Brian Florian, Feature Article—"Dialogue Normalization: Friend or Foe"—Jun. 2000, www.hometheaterhifi.com, (9 pgs).
Dolby Digital Professional Encoding Guidelines, (12 pgs).
John Couling, TV Loudness: time for a New Approach?, Dolby Laboratories, Inc., England, (5 pgs).
Dolby Laboratories, All About Audio Metadata, (5 pgs).

* cited by examiner

*Primary Examiner*—Brian Young
(74) *Attorney, Agent, or Firm*—Toler Law Group

(57) ABSTRACT

A method includes receiving first encoded digital audio data including a metadata parameter having a first value. The first encoded digital audio data has a first dynamic range. The method includes receiving second encoded digital audio data including the metadata parameter having the first value. The second encoded digital audio data has a second dynamic range. The method also includes outputting first decoded digital audio data including the metadata parameter. The first decoded digital audio data corresponds to the first encoded digital audio data. The method also includes outputting second decoded digital audio data including a modified metadata parameter having a second value. The second decoded digital audio data corresponds to the second encoded digital audio data.

23 Claims, 7 Drawing Sheets

SYSTEM AND METHOD TO MODIFY A METADATA PARAMETER

FIELD OF THE DISCLOSURE

The present disclosure is generally related to modifying a metadata parameter.

BACKGROUND

Digital audio data may include a dialog normalization (dialnorm) metadata parameter to set a standard volume level for dialog encoded by the digital audio data. The purpose of the dialnorm parameter is to prevent major changes in perceived volume level when media content changes, such as when one television program ends and another television program begins. The dialnorm parameter may be used by devices, such as set-top box devices, that decode digital audio data to maintain dialog of different content at the same perceived volume level. For example, a set-top box device may modify the dialnorm metadata parameter to maintain a −20 decibels Full Scale (dbFS) dialog level. To illustrate, when the set-top box device receives a movie having a dialnorm of −25 dbFS, the set-top box device may increase the dialnorm by 5 db and output the movie at a −20 dbFS dialog level. When the set-top box device receives a television program having a dialnorm of −18 dbFS, the set-top box device may decrease the dialnorm by 2 db to a −20 dbFS dialog level. In this way, the movie and the television program are output with the same dialnorm in an attempt to minimize any perceived difference in volume when media content received by the set-top box device transitions from the movie to the television program.

However, advertisers may reduce the dynamic range of advertisements while keeping the dialnorm at the same value as media content, resulting in the advertisements having a greater perceived loudness than the media content. Some viewers may find the perceived fluctuation in loudness from the media content to the advertisement annoying.

DETAILED DESCRIPTION

In a particular embodiment, a system includes an audio buffer operable to receive digital audio data. The system includes an audio sampler that is operable to sample the digital audio data to obtain first sampled digital audio data and to sample the digital audio data to obtain second sampled digital audio data. The system also includes a digital-to-analog (D/A) converter operable to convert the first sampled digital audio data to a first analog audio signal and to convert the second sampled digital audio data to a second analog audio signal. The system also includes a dynamic range analyzer operable to measure a first dynamic range of the first analog audio, to measure a second dynamic range of the second analog audio, and to measure a difference between the first dynamic range and the second dynamic range. The system also includes a metadata parameter modifier responsive to the dynamic range analyzer to modify a metadata parameter of the digital audio data.

In another particular embodiment, a method includes receiving first and second encoded digital audio data including a metadata parameter having a first value. The first encoded digital audio data has a first dynamic range and the second encoded digital audio data has a second dynamic range. The method also includes outputting first decoded digital audio data corresponding to the first encoded digital audio data and outputting second decoded digital audio data corresponding to the second encoded digital audio data. The first decoded digital audio data includes the metadata parameter having the first value. The second decoded digital audio data includes a modified metadata parameter having a second value.

In a particular embodiment, a computer-readable storage medium includes operational instructions, that when executed by a processor, cause the processor to receive digital audio data. The computer-readable storage medium also includes operational instructions, that when executed by the processor, further cause the processor to convert the digital audio data to an analog audio signal. The computer-readable storage medium further includes operational instructions, that when executed by the processor, cause the processor to measure a dynamic range of the analog audio signal. The processor modifies a metadata parameter of the digital audio data when the dynamic range is below a threshold.

Figure 1:
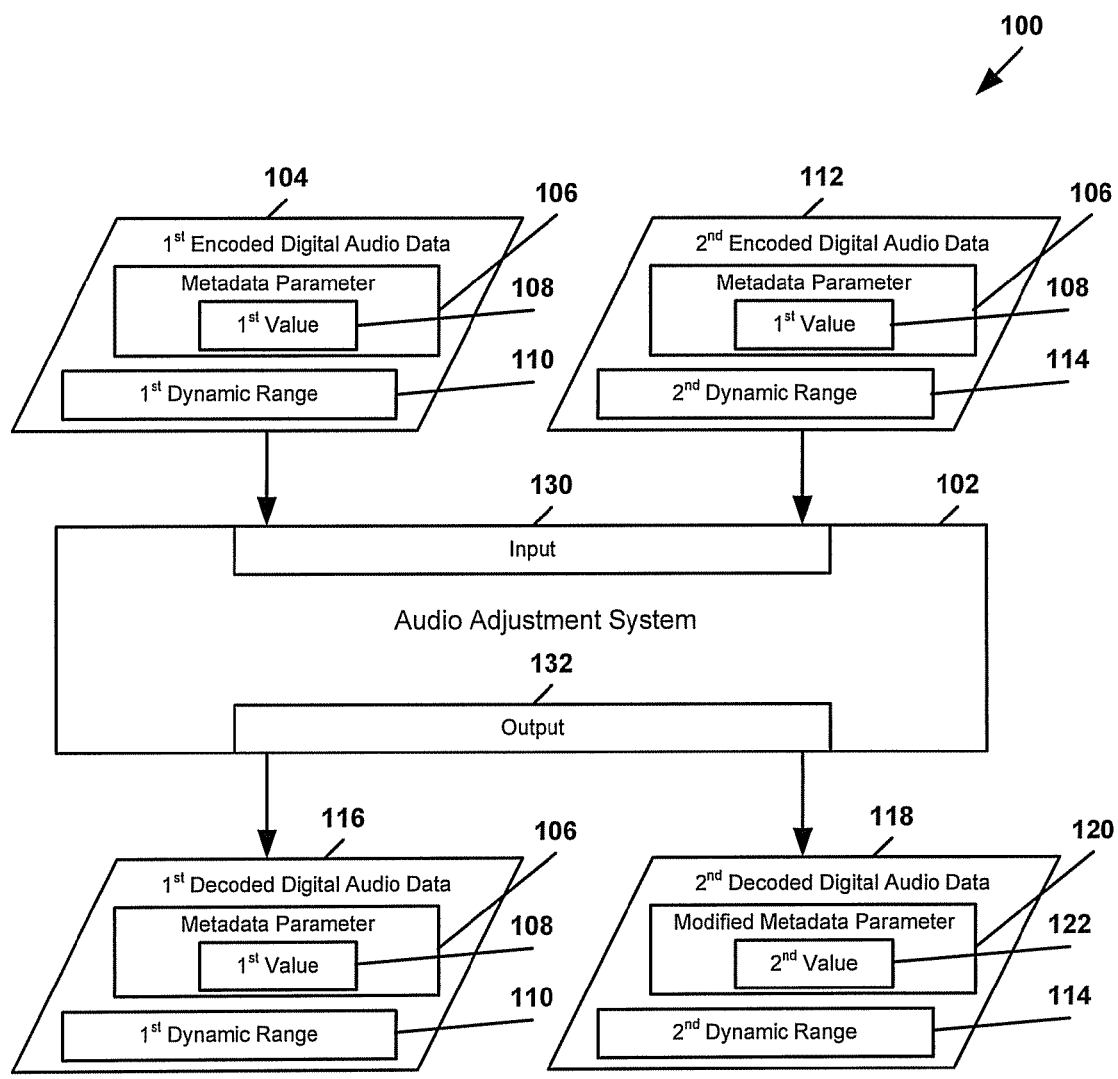
FIG. 1 is a block diagram of a first particular embodiment of a system to modify a metadata parameter.

Referring FIG. 1, a block diagram of a first particular embodiment of a system to modify a metadata parameter is depicted and generally designated 100. The system 100 includes an audio adjustment system 102.

The audio adjustment system 102 includes an input 130 and an output 132. The audio adjustment system 102 is operable to receive, at the input 130, first encoded digital audio data 104 including a metadata parameter 106 having a first value 108. The first encoded digital audio data 104 has a first dynamic range 110. The audio adjustment system 102 is further operable to receive, at the input 130, second encoded digital audio data 112 including the metadata parameter 106 having the first value 108. The second encoded digital audio data 112 has a second dynamic range 114.

The audio adjustment system 102 is operable to output, at the output 132, first decoded digital audio data 116 including the metadata parameter 106 having the first value of 108. The first decoded digital audio data 116 corresponds to the first encoded digital audio data 104. The audio adjustment system 102 is further operable to output, at the output 132, second decoded digital audio data 118. The second decoded digital audio data 118 includes a modified metadata parameter 120 having a second value 122. The second decoded digital audio data 118 corresponds to the second encoded digital audio data 112.

In operation, the audio adjustment system 102 receives the first encoded digital audio data 104 and the second encoded digital audio data 112. The audio adjustment system 102 determines that the metadata parameter 106 of the first and second encoded digital audio data 104 and 112 has the first value 108. The audio adjustment system 102 determines that the first encoded digital audio data 104 includes the first dynamic range 110 and the second encoded digital audio data 112 includes the second dynamic range 114. When the audio adjustment system 102 determines that the second dynamic range 114 differs from the first dynamic range 110 by more than a threshold, the audio adjustment system 102 outputs the modified metadata parameter 120 including the second value 122. In a particular embodiment, when the second dynamic range 114 is less than the first dynamic range 110, the audio adjustment system 102 outputs the modified metadata parameter 120 including the second value 122 that is less than the first value 108 of the metadata parameter 106. In a particular embodiment, when the second dynamic range 114 is greater than the first dynamic range 110, the audio adjustment system 102 outputs the modified metadata parameter 120 including the second value 122 that is greater than the first value 108.

When the first and second encoded digital audio data 104 and 112 have the metadata parameter 106 including the first value 108, and the second dynamic range 114 is different than the first dynamic range 110, the second encoded digital audio data 112 may have a different perceived loudness than the first encoded digital audio data 104. By outputting the modified metadata parameter 120 including the second value 122 when the second dynamic range 114 differs from the first dynamic range 110, the audio adjustment system 102 enables a perceived loudness of the second decoded digital audio data 118 to be substantially the same as a perceived loudness of the first decoded digital audio data 116. In a particular embodiment, the audio adjustment system 102 may modify the modified metadata parameter 120 based on a difference between the first dynamic range 110 and the second dynamic range 114. For example, the difference between the first value 108 and the second value 120 may be determined based on the difference between the first dynamic range 110 and the second dynamic range 114. Thus, by modifying the metadata parameter 106 to create the modified metadata parameter 120, the perceived loudness of the first and second decoded digital audio data 116 and 118 remains substantially the same when the first encoded digital audio data 104 is media content, such as a television program or a movie, and the second encoded digital audio data 112 is an advertisement.

In a particular embodiment, the audio adjustment system 102 is incorporated into a set-top box device, as will be described with respect to FIG. 2. In another particular embodiment, the audio adjustment system 102 is a standalone digital audio decoder, as will be described with respect to FIG. 3.

Figure 2:
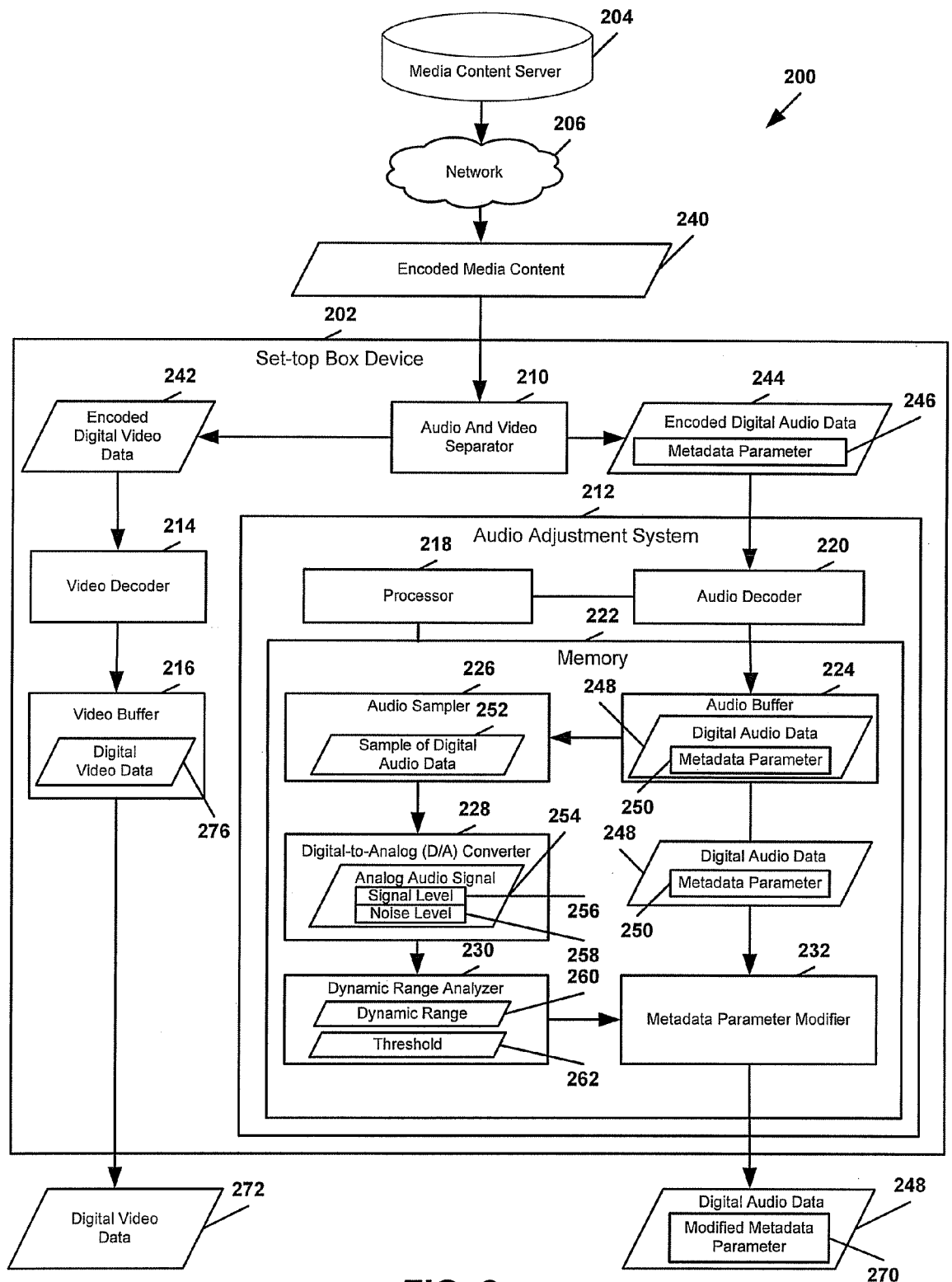
FIG. 2 is a block diagram of a second particular embodiment of a system to modify a metadata parameter.

Referring FIG. 2, a block diagram of a second particular embodiment of a system to modify a metadata parameter is depicted and generally designated 200. The system 200 includes a set-top box device 202 operable to receive encoded media content 240 from a media content server 204 via a network 206.

The set-top box device 202 is operable to receive encoded media content 240 and to output digital video data 272 and digital audio data 248. The set-top box device 202 includes an audio and video separator 210, an audio adjustment system 212, a video decoder 214, and a video buffer 216. The audio and video separator 210 is operable to receive the encoded media content 240, to output encoded digital video data 242, and to output encoded digital audio data 244. The video decoder 214 is operable to receive the encoded digital video data 242, to decode the encoded digital video data 242, and to place digital video data 276 at a video buffer 216.

The audio adjustment system 212 includes a processor 218, an audio decoder 220, and a memory 222. The audio adjustment system 212 is operable to receive the encoded digital audio data 244 that includes a metadata parameter 246 and to output the digital audio data 248 including a modified metadata parameter 270. In a particular embodiment, the audio adjustment system 212 is the audio adjustment system 102 shown in FIG. 1.

The audio decoder 220 is operable to receive the encoded digital audio data 244 and to decode the encoded digital audio data 244 to create the digital audio data 248 at the audio buffer 224. The memory 222 includes an audio buffer 224, an audio sampler 226, a digital-to-analog (D/A) converter 228, a dynamic range analyzer 230, and a metadata parameter modifier 232. The audio sampler 226 is operable to obtain a sample of digital audio data 252 of the digital audio data 248 at the audio buffer 224. The digital-to-analog (D/A) converter 228 is operable to receive the sample of digital audio data 252 and convert it to an analog audio signal 254 having a signal level 256 and a noise level 258. The dynamic range analyzer 230 is operable to determine a dynamic range 260 of the analog audio signal 254 and to compare the dynamic range 260 to a threshold 262. For example, the threshold 262 may be a predetermined decibel level that has a perceived loudness level that is greater than a decibel level of movies and television programs. To illustrate, when movies and television programs received at the set-top box device 202 have a dynamic range of sixty decibels, the threshold 262 may be set at fifty-seven decibels. The threshold 262 may have a default value, a user-selectable value, a value received from the media content server 204, or any combination thereof.

In a particular embodiment, the dynamic range analyzer 230 determines the dynamic range 260 by measuring the signal level 256 and the noise level 258 of the analog audio signal 254 and measuring the dynamic range 260 based on the signal level 256 and the noise level 258. The dynamic range analyzer 230 is further operable to instruct the metadata parameter modifier 232 to modify the metadata parameter 250 of the digital audio data 248 when the dynamic range 260 differs from the threshold 262 by more than a pre-determined amount. In a particular embodiment, the metadata parameter is a dialog normalization (dialnorm) parameter used to prevent major changes in perceived volume level when media content changes, such as when one television program ends and another television program begins. For example, when the metadata parameter 250 is a dialog normalization parameter, the metadata parameter modifier 232 may reduce the metadata parameter 250 by three decibels. In another particular embodiment, the metadata parameter 250 is modified concurrently with the video decoder 214 performing a decode operation of the encoded digital video data 242 at the video decoder 214.

The set-top box device 202 is operable to output the digital video data 272 and the digital audio data 248. In a particular embodiment, the digital video data 272 is synchronized for playback with the digital audio data 248. In another particular embodiment, the digital video data 272 is motion picture experts group (MPEG) compliant video.

In operation, the set-top box device 202 receives the encoded media content 240 from the media content server 204 via the network 206. In a particular embodiment, the encoded digital audio data 244 includes Dolby® digital compliant encoded digital audio data. The audio and video separator 210 receives the encoded media content 240 and outputs the encoded digital audio data 244 and the encoded digital video data 242. The audio adjustment system 212 receives the encoded digital audio data 244 including the metadata parameter 246. The audio sampler 226 samples the digital audio data 248 to create the sample of digital audio data 252. The digital-to-analog (D/A) converter 228 converts the sample of digital audio data 252 to the analog audio signal 254. The dynamic range analyzer 230 determines the dynamic range 260 of the sample of the analog audio signal 254. The dynamic range analyzer 230 instructs the metadata parameter modifier 232 to modify the metadata parameter 250 when the dynamic range 260 is below the threshold 262. In a particular embodiment, the metadata parameter 250 is a dialog normalization (dialnorm) parameter.

By modifying the metadata parameter 250 to create the modified metadata parameter 270, the audio adjustment system 212 modifies a perceived playback loudness of the digital audio data 248 when the dynamic range 260 is below the threshold 262. For example, when television programs have a dynamic range of sixty decibels and advertisements have a dynamic range of less than fifty decibels, the ten decibel difference in dynamic range may result in certain listeners perceiving the advertisements as louder than the television programs. By reducing the metadata parameter 250 of the advertisements by three decibels, the advertisements and the television programs may be output at approximately the same perceived loudness. Reducing fluctuations of the loudness of the digital audio data 248 may result in an improved listening experience.

Figure 3:
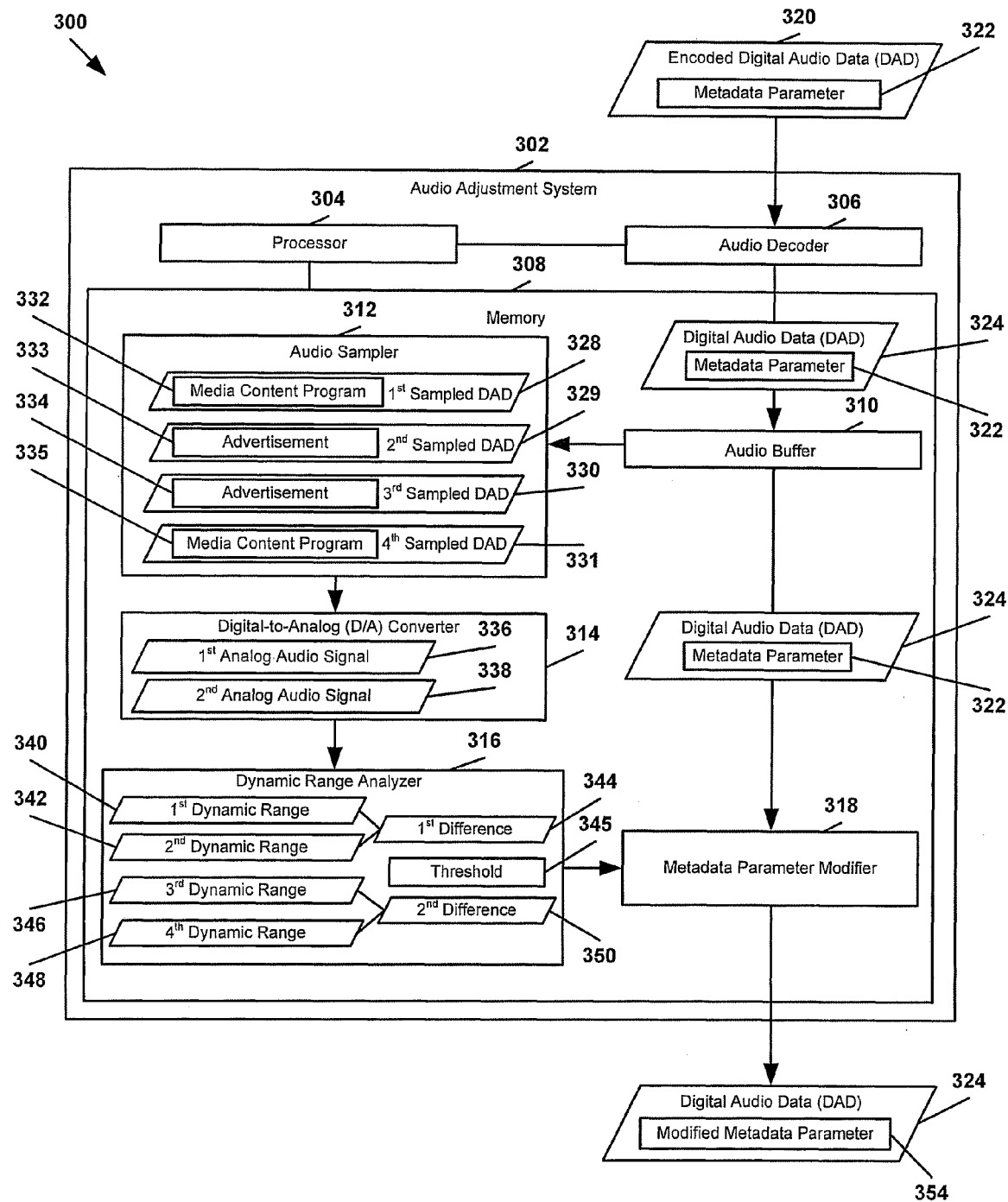
FIG. 3 is a block diagram of a third particular embodiment of a system to modify a metadata parameter.

FIG. 3 is a block diagram of a third particular embodiment of a system to modify a metadata parameter and is generally designated 300. The system 300 includes an audio adjustment system 302. In a particular embodiment, the audio adjustment system 302 is the audio adjustment system 102 of FIG. 1.

The audio adjustment system 302 is operable to receive encoded digital audio data (DAD) 320 including a metadata parameter 322 and to output DAD 324 including a modified metadata parameter 354. The audio adjustment system 302 includes a processor 304, an audio decoder 306 and a memory 308. The memory 308 includes an audio sampler 312, an audio buffer 310, a digital-to-analog (D/A) converter 314, a dynamic range analyzer 316, and a metadata parameter modifier 318.

The audio decoder 306 is operable to decode the encoded DAD 320 to generate the DAD 324 having the metadata parameter 322. The audio buffer 310 is operable to receive the DAD 324 from the audio decoder 306. The DAD 324 is also referred to as decoded digital audio data. The audio sampler 312 is operable to sample the DAD 324 to obtain a first sampled DAD 328 and a second sampled DAD 329. The digital-to-analog (D/A) converter 314 is operable to convert a sampled DAD to an analog audio signal. For example, the digital-to-analog (D/A) converter 314 may convert the first sampled DAD 328 to a first analog audio signal 336 and to convert the second sampled DAD 329 to a second analog audio signal 338.

The dynamic range analyzer 316 is operable to measure a first dynamic range 340 of the first analog audio signal 336 and to measure a second dynamic range 342 of the second analog audio signal 338. The dynamic range analyzer 316 is further operable to measure a first difference 344 between the first dynamic range 340 and the second dynamic range 342. For example, when the first dynamic range 340 is sixty decibels and the second dynamic range 342 is fifty decibels, the first difference 344 is ten decibels. The metadata parameter modifier 318 is responsive to the dynamic range analyzer 316 to modify the metadata parameter 322 of the DAD 324 when the first difference 344 is greater than a threshold 345. For example, when the first dynamic range 340 is sixty decibels and the second dynamic range 342 is fifty decibels, the dynamic range analyzer 316 may reduce the metadata parameter 322 by three decibels when the threshold 345 is nine decibels.

The audio sampler 312 may be configured to sample the digital audio data 324 at predetermined intervals. For example, the audio sample 312 may be operable to generate sampled digital audio data, such as the first sampled DAD 328, second sampled DAD 329, third sampled DAD 330, and fourth sampled DAD 331, at intervals of less than six hundred milliseconds. For example, the audio sampler 312 may sample the second sampled DAD 329 approximately five hundred milliseconds after sampling the first DAD 329. In a particular embodiment, the first sampled DAD 328 includes a media content program, such as a television program or a movie, and the second sampled DAD 329 includes an advertisement 334. The dynamic range analyzer 316 is further operable to measure a second difference 350 by measuring a third dynamic range 346 of a third sampled DAD 330 and measuring a fourth dynamic range 348 of a fourth sampled DAD 331. The metadata parameter modifier 318 is further operable to modify the metadata parameter 322 when the second difference 350 is less than the threshold 345. In a particular embodiment, the dynamic range analyzer 316 is operable to compare the second difference 350 to the threshold 345 and to instruct the metadata parameter modifier 318 to modify the metadata parameter 322.

In operation, the audio decoder 306 receives and decodes the encoded DAD 320 including the metadata parameter 322. In a particular embodiment, the metadata parameter 322 is a dialog normalization (dialnorm) parameter that is used to prevent major changes in perceived volume level when media content changes, such as when one television program ends and another television program begins. The decoded DAD 324 is stored at the audio buffer 310. The audio sampler 312 obtains the first sampled DAD 328 and the second sampled DAD 329 of the DAD 324 from the audio buffer 310. The D/A converter 314 converts the first sampled DAD 328 to a first analog audio signal 336 and converts the second sampled DAD 329 to a second analog audio signal 338. The dynamic range analyzer 316 determines a first dynamic range 340 of the first analog audio signal 336 and a second dynamic range 342 of the second analog audio signal 338. For example, the first dynamic range 340 may be determined by determining a signal-to-noise (S/N) ratio of the first analog audio signal 336. The dynamic range analyzer 316 determines a first difference 344 between the first dynamic range 340 and the second dynamic range 342. When the first difference 344 differs from a threshold 345 by more than a pre-determined amount, the dynamic range analyzer 316 instructs the metadata parameter modifier 318 to modify the metadata parameter 322 to create the modified metadata parameter 354 of the DAD 324. For example, when the first dynamic range 340 is sixty decibels and the second dynamic range 342 is fifty decibels, the first difference 344 is ten decibels. When the first difference 344 exceeds the threshold 345, the dynamic range analyzer 316 instructs the metadata parameter modifier 318 to reduce the metadata parameter 322, such as a dialog normalization parameter, by three decibels. In a particular embodiment, the threshold 345 is determined based on a default threshold. For example, the threshold 345 may have a default value, such as three decibels, or a user-selectable value.

In a particular embodiment, the metadata parameter modifier 318 is further operable to reduce the metadata parameter 322, such as a dialog normalization parameter, of the DAD 324 by approximately one-third of the dynamic range difference when the first difference 344 is greater than the threshold 345. For example, when the first difference 344 is ten decibels, the metadata parameter modifier 318 may reduce the metadata parameter 322 by three decibels. In another example, when the first difference 344 is six decibels, the metadata parameter modifier 318 may reduce the metadata parameter 322 by two decibels. In a particular embodiment, the metadata parameter modifier 318 is further operable to reduce the metadata parameter 322 of the DAD 324 by three decibels when the difference 344 is greater than the threshold 345.

By determining when the first dynamic range 340 differs from the second dynamic range 342 by more than the threshold 345, the audio adjustment system 302 is able to modify the metadata parameter 322 to minimize any perceived difference in loudness levels of the media content program 335 and the advertisement 334. By reducing perceived differences in loudness levels, listeners can enjoy a listening volume that does not fluctuate significantly when the encoded DAD 320 changes from the media content program 332 to the advertisement 333 and back again. For example, when the advertisement 333 has the first dynamic range 340 that is less than the second dynamic range 342 of the of the media content program 335 but both have the same dialnorm value as the metadata parameter 322, the advertisement 334 is perceived by a listener as louder than the media content program 335. By outputting the DAD 324 having the modified metadata parameter 354, the difference in perceived loudness between the advertisement 334 and the media content program 335 may be minimized.

Although various embodiments in FIG. 2 and FIG. 3 are illustrated having components that include computer readable instructions stored in memory that are executable by a processor, such as the audio buffer 224, the audio sampler 226, the D/A converter 228, the dynamic range analyzer 230, and the metadata parameter modifier 232 of FIG. 2 and the audio buffer 310, the audio sampler 312, the D/A converter 314, the dynamic range analyzer 316, and the metadata parameter modifier 318 of FIG. 3, in other embodiments one or more of the components of FIG. 2 and FIG. 3 may be implemented in the form of firmware, hardware, software executed by a processor, or any combination thereof.

Figure 4:
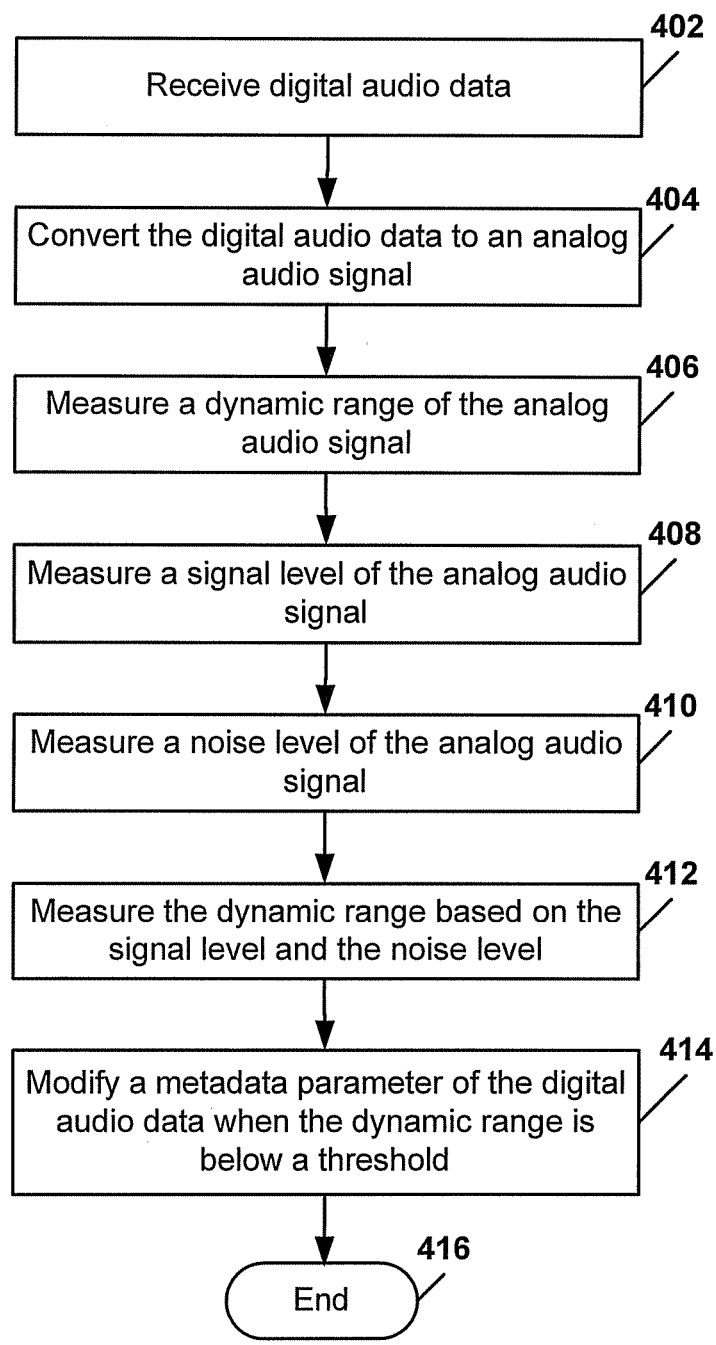
FIG. 4 is a flow diagram of a first particular embodiment of a method to modify a metadata parameter.

FIG. 4 is a flow diagram of a first particular embodiment of a method of modifying a metadata parameter. The method may be performed by the audio adjustment system 102 of FIG. 1, the audio adjustment system 202 of FIG. 2, or the audio adjustment system 302 of FIG. 3.

Digital audio data is received, at 402. For example, in FIG. 2, encoded digital audio data 244 is received by the audio adjustment system 212. Continuing to 404, the digital audio data is converted to an analog audio signal. For example, in FIG. 2, the audio sampler 226 converts the digital audio data 248 to create the sample of digital audio data 252. Proceeding to 406, a dynamic range of the analog audio signal is measured. For example, in FIG. 2, the dynamic range analyzer 230 measures the dynamic range 260 of the analog audio signal 254. Moving to 408, a signal level of the analog audio signal may be measured. For example, in FIG. 2, the D/A converter 228 measures the signal level 256 of the analog audio signal 254. Moving to 410, a noise level of the analog audio signal may be measured. For example, in FIG. 2, the D/A converter 228 measures the noise level 258 of the analog audio signal 254. Moving to 412, the dynamic range may be measured based on the signal level and the noise level. For example, in FIG. 2, the dynamic range analyzer 230 measures the dynamic range 260 based on the signal level 256 and the noise level 258 of the analog audio signal 254. Proceeding to 414, a metadata parameter of the digital audio is modified when the dynamic range is below a threshold. For example, in FIG. 2, the metadata parameter 250 is modified to create the modified metadata parameter 270 when the dynamic range 260 is below the threshold 262. The method ends at 416. By modifying the metadata parameter when the dynamic range is below a threshold, fluctuations between a perceived loudness of different media content may be reduced.

Figure 5:
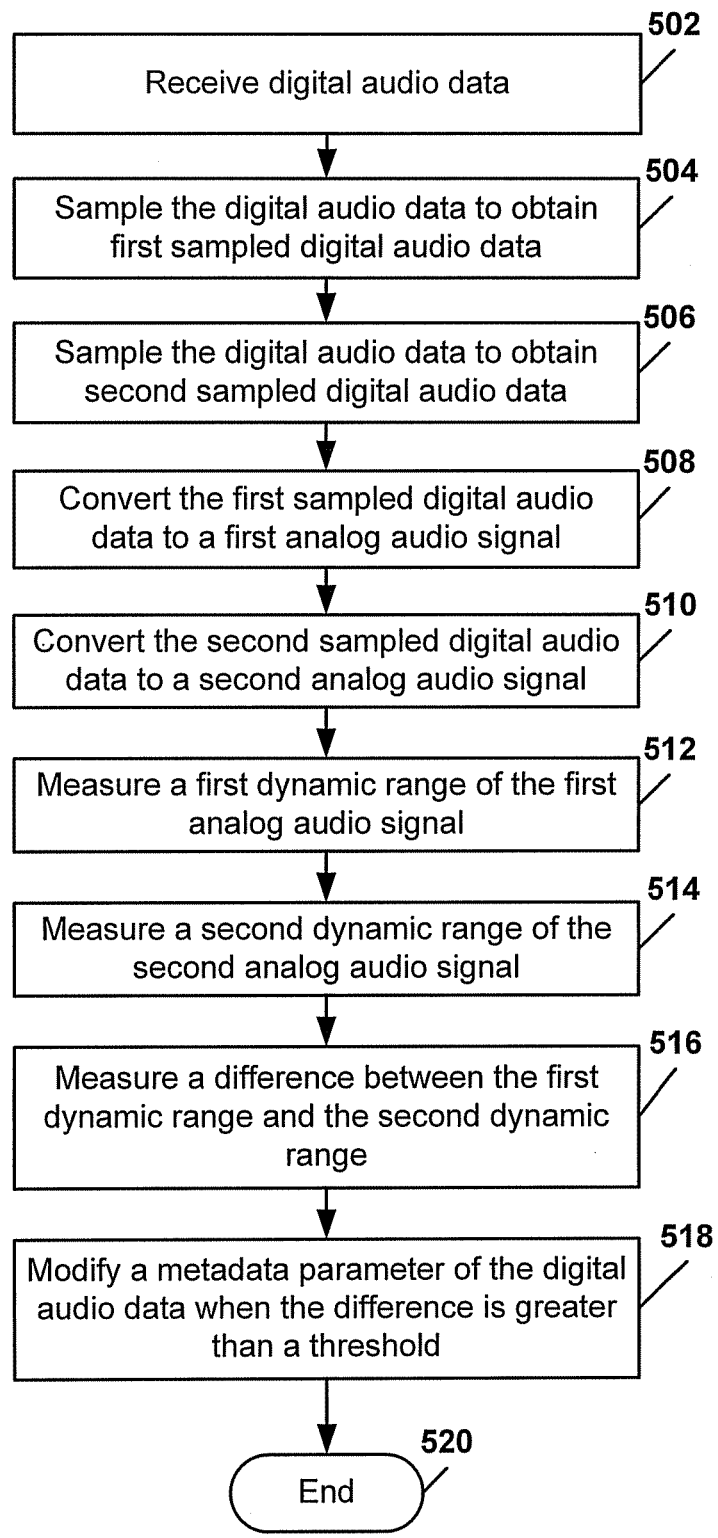
FIG. 5 is a flow diagram of a second particular embodiment of a method to modify a metadata parameter.

FIG. 5 is a flow diagram of a second particular embodiment of a method to modify a metadata parameter. The method may be performed by an audio adjustment system, such as the audio adjustment system 102 of FIG. 1, the audio adjustment system 202 of FIG. 2, or the audio adjustment system 302 of FIG. 3.

Digital audio data is received at 502. For example, in FIG. 3, digital audio data (DAD) 324 is received at the audio buffer 310. Continuing to 504, the digital audio data is sampled to obtain a first sample of digital audio data. For example, in FIG. 3, the DAD 324 is sampled by the audio sampler 312 to obtain the first sampled DAD 328. Moving to 506, the digital audio data is sampled to obtain a second sample of digital audio data. For example, in FIG. 3, the DAD 324 is sampled by the audio sampler 312 to obtain the second sampled DAD 329.

Proceeding to 508, the first sampled digital audio data is converted to a first analog audio signal. For example, in FIG. 3, the D/A converter 314 converts the first sampled DAD 328 to the first analog audio signal 336. Advancing to 510, the second sampled digital audio data is converted to a second analog audio signal. For example, in FIG. 3, the D/A converter 314 converts the second sampled DAD 329 to the second analog audio signal 338. Moving to 512, a first dynamic range of the analog audio signal is measured. For example, in FIG. 3, the dynamic range analyzer 316 measures the first dynamic range 340 of the first analog audio signal 336. Advancing to 514, a second dynamic range of the second analog audio signal is measured. For example, in FIG. 3, the dynamic range analyzer 316 measures the second dynamic range 342 of the second analog audio signal 338.

Proceeding to 516, a difference between the first dynamic range and the second dynamic range is measured. For example, in FIG. 3, the dynamic range analyzer 316 measures the first difference 334 between the first dynamic range 340 and the second dynamic range 342. Advancing to 518, a metadata parameter of the digital audio data is modified when the difference is greater than a threshold. For example, in FIG. 3, the dynamic range analyzer 316 instructs the metadata parameter modifier 318 to modify the metadata parameter 322 when the first difference 344 is greater than the threshold 345. The method ends at 520. Thus, when an advertisement and a television program have a same metadata parameter, such as a dialog normalization parameter, and the advertisement has a first dynamic range that is less than a second dynamic range of the television program, a listener listening to playback of the advertisement and television program may perceive the advertisement as louder than the television program. By reducing the dialog normalization parameter when the difference between the first dynamic range and the second dynamic range is more than a perceivable threshold, fluctuations between a perceived loudness of the television program and the advertisement may be reduced.

Figure 6:
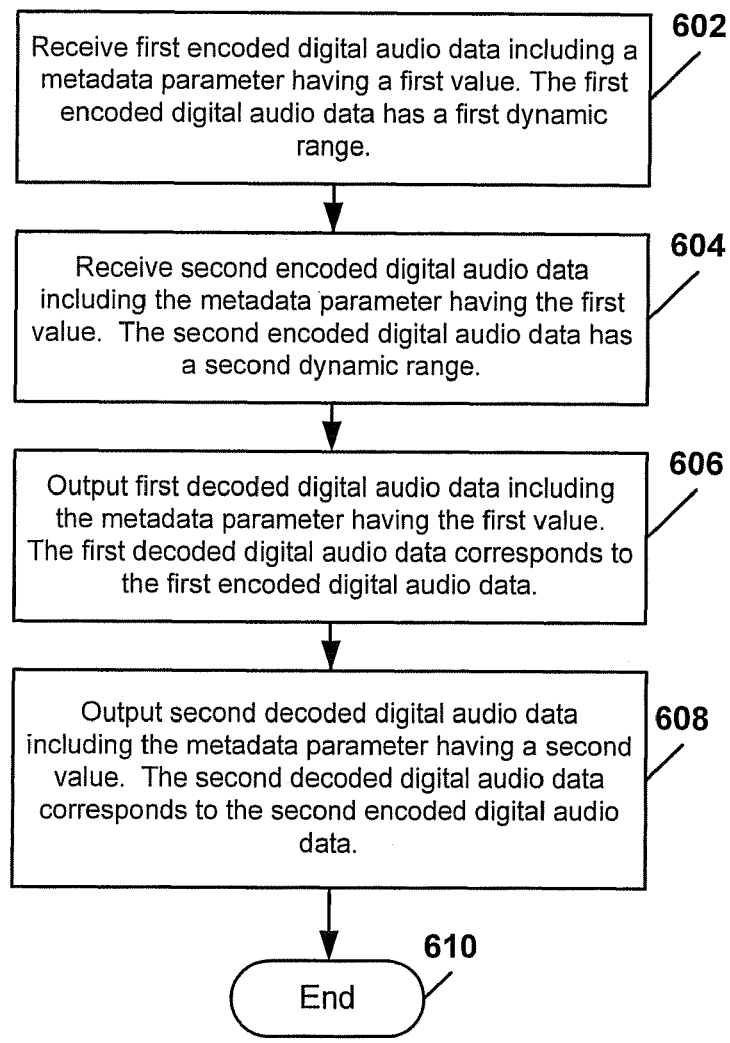
FIG. 6 is a flow diagram of a third particular embodiment of a method to modify a metadata parameter.

FIG. 6 is a flow diagram of a third particular embodiment of a method to modify a metadata parameter. The method may be performed by an audio adjustment system, such as the audio adjustment system 102 depicted in FIG. 1, the audio adjustment system 202 depicted in FIG. 2, or the audio adjustment system 302 depicted in FIG. 3.

First encoded digital audio data including a metadata parameter having a first value is received, at 602. The first encoded digital audio data has a first dynamic range. For example, in FIG. 1, the first encoded digital audio data 104 includes the metadata parameter 106 with the first value 108 and the first dynamic range 110. Moving to 604, the second encoded digital audio data including the metadata parameter with the first value is received. The second encoded digital audio data has a second dynamic range. For example, in FIG. 1, the second encoded digital audio data 112 includes the metadata parameter 106 with the first value 108 and the second dynamic range 114.

Continuing to 606, the method includes outputting first decoded audio data including the metadata parameter having the first value. The first decoded digital audio data corresponds to the first encoded digital audio data. For example, in FIG. 1, the first decoded digital audio data 116, corresponding to the first encoded digital audio data 104, is output by the audio adjustment system 102 at the output 132. The first decoded digital audio data 116 includes the metadata parameter 106 having the first value 108. Advancing to 608, the second decoded digital audio data including the metadata parameter having a second value is output. The second decoded digital audio data corresponds to the second encoded digital audio data. For example, in FIG. 1, the second decoded digital audio data 118 including the metadata parameter 106 having the second value 120 is output by the audio adjustment system 102. The second decoded digital audio data 118 corresponds to the second encoded digital audio data 112. The method ends at 610.

Figure 7:
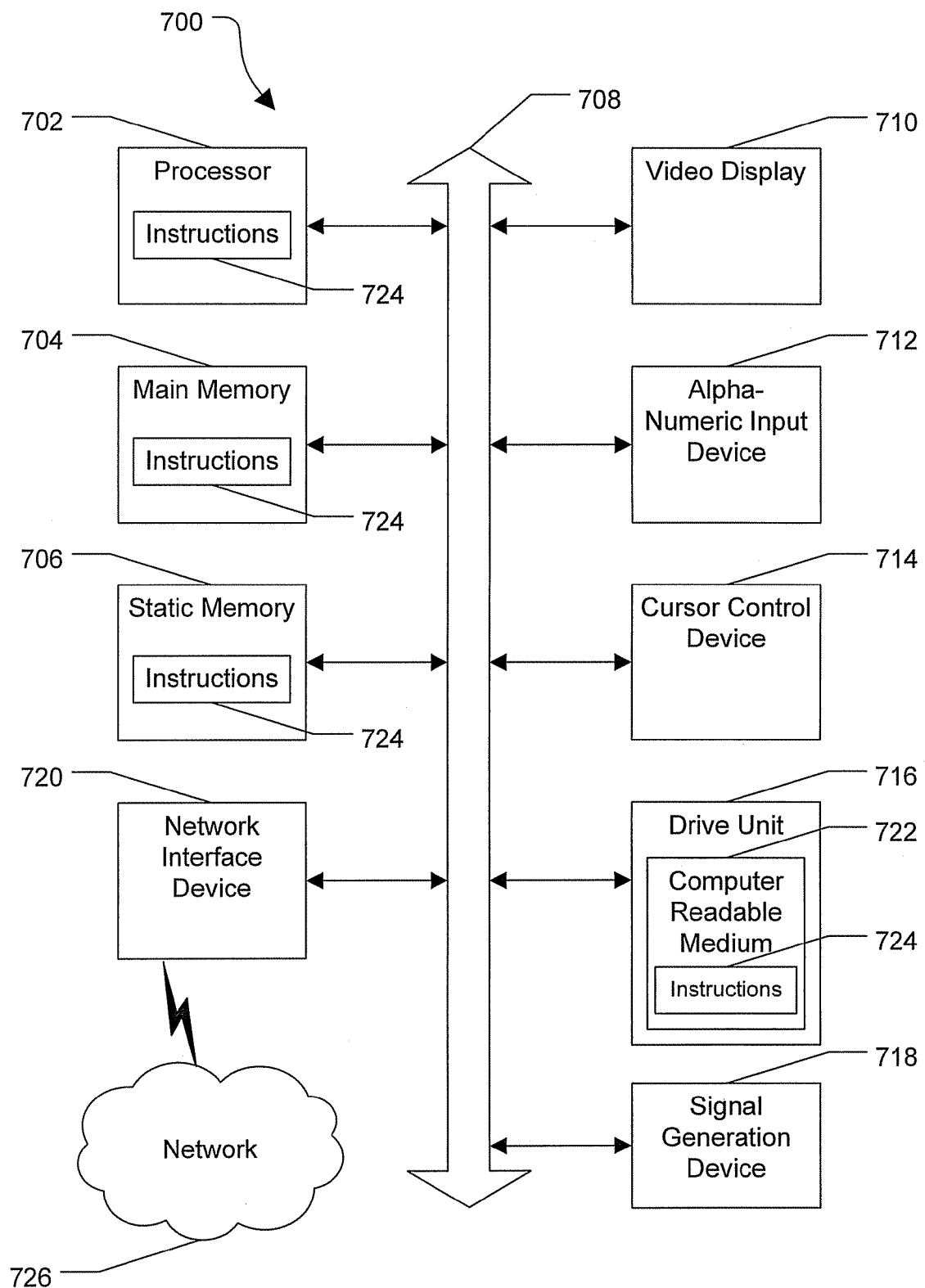
FIG. 7 is a block diagram of an illustrative embodiment of a general computer system.

Referring to FIG. 7, an illustrative embodiment of a general computer system is shown and is designated 700. The computer system 700 can include a set of instructions that can be executed to cause the computer system 700 to perform any one or more of the methods or computer based functions disclosed herein. The computer system 700, or any portion thereof, may operate as a standalone device or may be connected, e.g., using a network, to other computer systems or peripheral devices, including a media content server or a set-top box device, as shown in FIG. 2.

In a networked deployment, the computer system may operate in the capacity of a server, such as a video server or application server, or a set-top box device. The computer system 700 can also be implemented as or incorporated into various devices, such as a personal computer (PC), a tablet PC, a set-top box (STB) device, a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 700 can be implemented using electronic devices that provide voice, video or data communication. Further, while a single computer system 700 is illustrated, the term "system" shall also be taken to include any collection of systems or sub-systems that individually or jointly execute a set, or multiple sets, of instructions to perform one or more computer functions.

As illustrated in FIG. 7, the computer system 700 may include a processor 702, e.g., a central processing unit (CPU), a graphics-processing unit (GPU), or both. Moreover, the computer system 700 can include a main memory 704 and a static memory 706 that can communicate with each other via a bus 708. As shown, the computer system 700 may further include a video display unit 710, such as a liquid crystal display (LCD), an organic light emitting diode (OLED), a flat panel display, a solid-state display, or a cathode ray tube (CRT). Additionally, the computer system 700 may include an input device 712, such as a keyboard, and a cursor control device 714, such as a mouse. The computer system 700 can also include a disk drive unit 716, a signal generation device 718, such as a speaker or remote control, and a network interface device 720.

In a particular embodiment, as depicted in FIG. 7, the disk drive unit 716 may include a computer-readable medium 722 in which one or more sets of instructions 724, e.g. software, can be embedded. Further, the instructions 724 may embody one or more of the methods or logic as described herein. In a particular embodiment, the instructions 724 may reside completely, or at least partially, within the main memory 704, the static memory 706, and/or within the processor 702 during execution by the computer system 700. The main memory 704 and the processor 702 also may include computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 724 or receives and executes instructions 724 responsive to a propagated signal, so that a device connected to a network 726 can communicate voice, video or data over the network 726. Further, the instructions 724 may be transmitted or received over the network 726 via the network interface device 720.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an email or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In accordance with various embodiments, the methods described herein may be implemented as one or more software programs running on a computer processor. Dedicated hardware implementations including, but not limited to, application specific integrated circuits, programmable logic arrays and other hardware devices can likewise be constructed to implement the methods described herein. Furthermore, alternative software implementations including, but not limited to, distributed processing or component/object distributed processing, parallel processing, or virtual machine processing can also be constructed to implement the methods described herein.

It should also be noted that software that implements the disclosed methods may optionally be stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. The software may also utilize a signal including computer instructions. A digital file attachment to e-mail or other self-contained information archive or set of archives is considered a distribution medium equivalent to a tangible storage medium. Accordingly, the disclosure is considered to include a tangible storage medium or distribution medium as listed herein, and other equivalents and successor media, in which the software implementations herein may be stored.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.52(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A computer-readable storage medium comprising operational instructions, that when executed by a processor, cause the processor to:
   receive digital audio data;
   convert the digital audio data to an analog audio signal;
   measure a dynamic range of the analog audio signal; and
   modify a metadata parameter of the digital audio data when the dynamic range is below a threshold, the metadata parameter being a dialog normalization parameter that is modified based at least partially on the dynamic range.

2. The computer-readable storage medium of claim 1, wherein the threshold is determined based on a user selection.

3. The computer-readable storage medium of claim 1, further comprising operational instructions, that when executed by the processor, cause the processor to:
   measure a signal level of the analog audio signal;
   measure a noise level of the analog audio signal; and
   measure the dynamic range based on the signal level and the noise level.

4. The computer-readable storage medium of claim 1, wherein digital video data is synchronized for playback with the digital audio data.

5. The computer-readable storage medium of claim 4, wherein the digital video data includes motion picture experts group (MPEG) compliant video.

6. The computer-readable storage medium of claim 1, wherein the metadata parameter is modified concurrently with a decode operation at a video decoder.

7. A system, comprising:
   an audio buffer operable to receive digital audio data;
   an audio sampler operable to sample the digital audio data to obtain first sampled digital audio data and to sample the digital audio data to obtain second sampled digital audio data;
   a digital-to-analog (D/A) converter operable to convert the first sampled digital audio data to a first analog audio signal and to convert the second sampled digital audio data to a second analog audio signal;

a dynamic range analyzer operable to measure a first dynamic range of the first analog audio, to measure a second dynamic range of the second analog audio, and to measure a difference between the first dynamic range and the second dynamic range; and a metadata parameter modifier responsive to the dynamic range analyzer to selectively modify a metadata parameter of the digital audio data based on the difference.

8. The system of claim 7, wherein the metadata parameter is a dialog normalization parameter.

9. The system of claim 8, wherein the dialog normalization parameter is modified when the difference is greater than a threshold.

10. The system of claim 9, wherein the threshold is determined based on a default threshold.

11. The system of claim 9, wherein the threshold is three decibels.

12. The system of claim 9, wherein the metadata parameter modifier is further operable to reduce the dialog normalization parameter of the digital audio data by approximately one third of the difference between the first dynamic range and the second dynamic range when the difference is greater than the threshold.

13. The system of claim 9, wherein the metadata parameter modifier is further operable to reduce the dialog normalization parameter of the digital audio data by three decibels.

14. The system of claim 9, wherein the first sampled digital audio data includes a media content program and the second sampled digital audio data includes an advertisement.

15. The system of claim 14, wherein the dialog normalization parameter of the advertisement has a same value as the dialog normalization parameter of the media content program, wherein the advertisement has a reduced dynamic range to be perceived as louder than the media content program by a listener, and wherein modifying the metadata parameter reduces a difference in perceived loudness between the advertisement and the media content program.

16. The system of claim 8, wherein the audio sampler is operable to sample the second sampled digital audio data less than six hundred milliseconds after sampling the first sampled digital audio data.

17. The system of claim 9, wherein the dynamic range analyzer is further operable to:

measure a third dynamic range of a third sampled digital audio data; and measure a fourth dynamic range of a fourth sampled digital audio data.

18. The system of claim 17, wherein the dynamic range analyzer is further operable to measure a second difference based on the third dynamic range and the fourth dynamic range.

19. The system of claim 18, wherein the metadata parameter modifier is further operable to modify the metadata parameter of the digital audio data when the second difference is less than the threshold.

20. A method, comprising:

receiving first encoded digital audio data including a metadata parameter, the first encoded digital audio data having a first dynamic range;

receiving second encoded digital audio data including the metadata parameter having the first value, the second encoded digital audio data having a second dynamic range;

outputting first decoded digital audio data including the metadata parameter having the first value, the first decoded digital audio data corresponding to the first encoded digital audio data; and outputting second decoded digital audio data including a modified metadata parameter having a second value, the second decoded digital audio data corresponding to the second encoded digital audio data.

21. The method of claim 20, wherein the second value is less than the first value when the second dynamic range is less than the first dynamic range.

22. The method of claim 20, wherein the second value is greater than the first value when the second dynamic range is greater than the first dynamic range.

23. The method of claim 20, wherein a first perceived loudness of the first decoded digital audio data is substantially the same as a second perceived loudness of the second decoded digital audio data.

* * * * *